(12) United States Patent
Wu

(10) Patent No.: US 9,831,207 B2
(45) Date of Patent: *Nov. 28, 2017

(54) NO-FLOW UNDERFILL FOR PACKAGE WITH INTERPOSER FRAME

(71) Applicant: TAIWAN SEMICONDUCTOR MANUFACTURING COMPANY, LTD., Hsinchu (TW)

(72) Inventor: Jiun Yi Wu, Jhongli (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/593,649

(22) Filed: Jan. 9, 2015

(65) Prior Publication Data
US 2015/0123272 A1 May 7, 2015

Related U.S. Application Data

(63) Continuation of application No. 13/536,905, filed on Jun. 28, 2012, now Pat. No. 8,946,072.

(Continued)

(51) Int. Cl.
*H01L 23/31* (2006.01)
*H01L 23/00* (2006.01)
(Continued)

(52) U.S. Cl.
CPC ............ *H01L 24/17* (2013.01); *H01L 21/563* (2013.01); *H01L 23/3121* (2013.01);
(Continued)

(58) Field of Classification Search
CPC ....... H01L 24/17; H01L 24/81; H01L 23/481; H01L 21/563; H01L 23/5385;
(Continued)

(56) References Cited

U.S. PATENT DOCUMENTS 3,811,186 A * 5/1974 Larnerd ................. H01L 24/81
174/253
5,275,330 A * 1/1994 Isaacs .................. B23K 1/0016
228/180.21

(Continued)

OTHER PUBLICATIONS

CJ, Bill, et al., "Advanced QFN Packaging for Low Cost and Solution", 2010 11th International Conference on Electronic Packaging Technology & High Density Packaging, pp. 45-49.

(Continued)

*Primary Examiner* — Earl Taylor
(74) *Attorney, Agent, or Firm* — Hauptman Ham, LLP

(57) ABSTRACT

A method of forming a package on a package structure includes applying a no-reflow underfill (NUF) layer over a substrate, wherein the substrate has at least one first bump and a plurality of second bumps surrounding the at least one first bump. The method further includes bonding a semiconductor die to the at least one first bump. The method further includes bonding an interposer frame to the plurality of second bumps, wherein the interposer frame surrounds the semiconductor die, wherein the semiconductor die is disposed in an opening of the interposer frame.

20 Claims, 6 Drawing Sheets

Related U.S. Application Data

(60) Provisional application No. 61/594,141, filed on Feb. 2, 2012, provisional application No. 61/616,958, filed on Mar. 28, 2012, provisional application No. 61/604,414, filed on Feb. 28, 2012.

(51) Int. Cl.
*H01L 23/538* (2006.01)
*H01L 21/56* (2006.01)
*H01L 25/10* (2006.01)
*H01L 25/00* (2006.01)
*H01L 23/48* (2006.01)
*H01L 23/14* (2006.01)

(52) U.S. Cl.
CPC ........ *H01L 23/3157* (2013.01); *H01L 23/481* (2013.01); *H01L 23/5384* (2013.01); *H01L 23/5385* (2013.01); *H01L 24/81* (2013.01); *H01L 25/105* (2013.01); *H01L 25/50* (2013.01); *H01L 23/147* (2013.01); *H01L 24/16* (2013.01); *H01L 24/32* (2013.01); *H01L 24/48* (2013.01); *H01L 2224/16225* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2225/1023* (2013.01); *H01L 2225/1041* (2013.01); *H01L 2225/1058* (2013.01); *H01L 2225/1076* (2013.01); *H01L 2924/00014* (2013.01); *H01L 2924/01322* (2013.01); *H01L 2924/1305* (2013.01); *H01L 2924/13091* (2013.01); *H01L 2924/15192* (2013.01); *H01L 2924/15311* (2013.01); *H01L 2924/18161* (2013.01)

(58) Field of Classification Search
CPC ..... H01L 2924/181; H01L 2224/17051; H01L 2225/1058; H01L 2224/73204; H01L 24/16; H01L 2924/15311
USPC ................................................. 257/789, 795
See application file for complete search history.

(56) References Cited

U.S. PATENT DOCUMENTS

| | | | | |
|---|---|---|---|---|
| 5,331,591 A * | 7/1994 | Clifton | H01L 25/105 | 365/182 |
| 5,347,162 A * | 9/1994 | Pasch | G03F 7/70433 | 257/773 |
| 5,834,799 A * | 11/1998 | Rostoker | G03F 7/70433 | 257/434 |
| 6,121,553 A * | 9/2000 | Shinada | H01L 23/49894 | 174/255 |
| 6,297,141 B1 * | 10/2001 | Miyazaki | H01L 23/49827 | 257/773 |
| 6,773,958 B1 * | 8/2004 | Wang | H01L 21/563 | 257/E21.503 |
| 7,230,330 B2 * | 6/2007 | Lee | H01L 21/486 | 257/686 |
| 7,728,429 B2 * | 6/2010 | Aokura | H01L 23/13 | 257/673 |
| 7,755,181 B2 * | 7/2010 | Han | H05K 3/3436 | 257/685 |
| 7,800,212 B2 * | 9/2010 | Yoon | H01L 23/3128 | 257/685 |
| 7,851,894 B1 * | 12/2010 | Scanlan | H01L 23/3128 | 257/659 |
| 8,058,101 B2 * | 11/2011 | Haba | G01R 31/2886 | 257/678 |
| 8,089,143 B2 * | 1/2012 | Lee | H01L 23/13 | 257/678 |
| 8,115,292 B2 * | 2/2012 | Toh | H01L 23/3171 | 257/686 |
| 8,207,618 B2 * | 6/2012 | Shimizu | H01L 21/561 | 257/787 |
| 8,283,767 B1 * | 10/2012 | Berry | H01L 21/561 | 257/686 |
| 8,704,354 B2 * | 4/2014 | Cheng | H01L 23/3114 | 257/686 |
| 8,766,460 B2 * | 7/2014 | Wu | H01L 21/76882 | 257/686 |
| 8,946,072 B2 * | 2/2015 | Wu | H01L 24/81 | 257/698 |
| 9,006,032 B2 * | 4/2015 | Cheng | H01L 23/3114 | 257/686 |
| 9,006,033 B2 * | 4/2015 | Wu | H01L 21/76882 | 438/108 |
| 2003/0025204 A1 * | 2/2003 | Sakai | H01L 23/49816 | 257/738 |
| 2006/0043583 A1 * | 3/2006 | Tamagawa | H01L 23/36 | 257/720 |
| 2006/0175695 A1 * | 8/2006 | Lee | H01L 23/13 | 257/686 |
| 2007/0007641 A1 * | 1/2007 | Lee | H01L 24/97 | 257/691 |
| 2007/0145548 A1 * | 6/2007 | Park | H01L 21/6835 | 257/678 |
| 2008/0157326 A1 * | 7/2008 | Han | H05K 3/3436 | 257/686 |
| 2009/0166834 A1 * | 7/2009 | Yoon | H01L 23/3128 | 257/686 |
| 2009/0289336 A1 * | 11/2009 | Meghro | H01L 23/49517 | 257/676 |
| 2010/0108371 A1 * | 5/2010 | Furutani | H01L 21/56 | 174/260 |
| 2010/0117218 A1 * | 5/2010 | Park | H01L 21/563 | 257/693 |
| 2010/0164120 A1 * | 7/2010 | Nakayama | H01L 21/486 | 257/774 |
| 2010/0187675 A1 * | 7/2010 | Shimizu | H01L 21/561 | 257/690 |
| 2010/0276803 A1 * | 11/2010 | Higuchi | H01L 24/13 | 257/738 |
| 2010/0289133 A1 * | 11/2010 | Chao | H01L 21/56 | 257/692 |
| 2010/0327419 A1 * | 12/2010 | Muthukumar | H01L 23/3121 | 257/686 |
| 2011/0056740 A1 * | 3/2011 | Takano | H01L 21/486 | 174/262 |
| 2011/0129960 A1 * | 6/2011 | Park | H01L 21/563 | 438/107 |
| 2011/0317388 A1 * | 12/2011 | Watanabe | H01L 21/563 | 361/783 |
| 2012/0112360 A1 * | 5/2012 | Son | H01L 21/56 | 257/774 |
| 2012/0119388 A1 * | 5/2012 | Cho | H01L 21/56 | 257/778 |
| 2012/0168219 A1 * | 7/2012 | Kitamura | H01L 24/80 | 174/263 |
| 2013/0099378 A1 * | 4/2013 | Cho | H01L 21/56 | 257/737 |
| 2013/0105967 A1 * | 5/2013 | Lee | H01L 23/49894 | 257/737 |
| 2013/0127054 A1 * | 5/2013 | Muthukumar | H01L 23/3121 | 257/738 |
| 2013/0200512 A1 * | 8/2013 | Wu | H01L 21/76882 | 257/737 |
| 2013/0200513 A1 * | 8/2013 | Wu | H01L 24/81 | 257/737 |
| 2013/0200517 A1 * | 8/2013 | Wu | H01L 23/3121 | 257/741 |
| 2013/0256914 A1 * | 10/2013 | Cheng | H01L 23/3114 | 257/777 |
| 2014/0197547 A1 * | 7/2014 | Cheng | H01L 23/3114 | 257/777 |

(56) References Cited

U.S. PATENT DOCUMENTS

| | | | | |
|---|---|---|---|---|
| 2014/0273355 A1* | 9/2014 | Wu | ........................ | H01L 25/105 |
| | | | | 438/126 |
| 2015/0123272 A1* | 5/2015 | Wu | ......................... | H01L 24/81 |
| | | | | 257/737 |
| 2015/0214181 A1* | 7/2015 | Cheng | ................. | H01L 23/3114 |
| | | | | 438/126 |

OTHER PUBLICATIONS

Lim, L. A., et al., "DreamPAK—Small Form Factor Package", EMPC 2009, pp. 1-6.
Tseng, Andy, et al, "Advanced QFN Surface Mount Application Notes Development", 2010 12th Electronics Packaging Technology Conference, pp. 737-742.
Servals, G. E., et al., "Wire Bonding—A Closer Look", The 17th International Symposium for Testing & Failure Analysis, Nov. 11-15, 1991, pp. 525-529.

\* cited by examiner

NO-FLOW UNDERFILL FOR PACKAGE WITH INTERPOSER FRAME

PRIORITY CLAIM

This application is a continuation of U.S. application Ser. No. 13/536,905, filed Jun. 28, 2012, which claims the priority of U.S. Provisional Application No. 61/594,141, filed Feb. 2, 2012, U.S. Provisional Application No. 61/616,958, filed Mar. 28, 2012 and U.S. Provisional Application No. 61/604,414, filed Feb. 28, 2012; which are incorporated herein by reference in their entireties.

RELATED APPLICATIONS

This application is related to U.S. application Ser. No. 13/433,210, filed Mar. 28, 2012 and U.S. application Ser. No. 13/448,796, and filed Apr. 17, 2012; which are incorporated by reference herein in their entireties.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less areas or smaller heights than packages of the past, in some applications.

Thus, new packaging technologies, such as wafer level packaging (WLP) and package on package (PoP), have begun to be developed. These relatively new types of packaging technologies for semiconductors face manufacturing challenges.

BRIEF DESCRIPTION OF THE DRAWINGS

For a more complete understanding of the present disclosure, and some advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are illustrative and do not limit the scope of the disclosure.

Figure 1A:
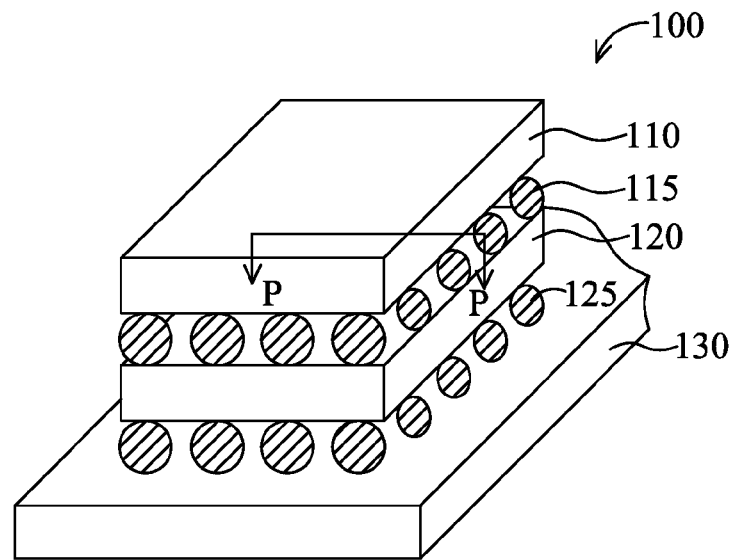
FIG. 1A is a perspective view of a package using the package on package (PoP) technology (also referred to as "a PoP package") including a package bonded to another package, which is further bonded to a substrate in accordance with some embodiments.

FIG. 1A is a perspective view of a package on package (PoP) package 100 including a package 110 bonded to another package 120, which is further bonded to a substrate 130 in accordance with some embodiments. Each package, such as package 110 or package 120, includes at least a semiconductor die (not shown). The semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Substrate 130 may include a semiconductor wafer, or a portion of wafer. In some embodiments, substrate 130 includes silicon, gallium arsenide, silicon-on-insulator ("SOI") or other similar materials. In some embodiments, substrate 130 also includes passive devices such as resistors, capacitors, inductors and the like, or active devices such as transistors. In some embodiments, substrate 130 includes additional integrated circuits. Substrates 130 may further include through substrate vias (TSVs) and may be an interposer. In addition, the substrate 130 may include other materials. For example, in some embodiments, substrate 130 is a multiple-layer circuit board. In some embodiments, substrate 130 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

Figure 1B:
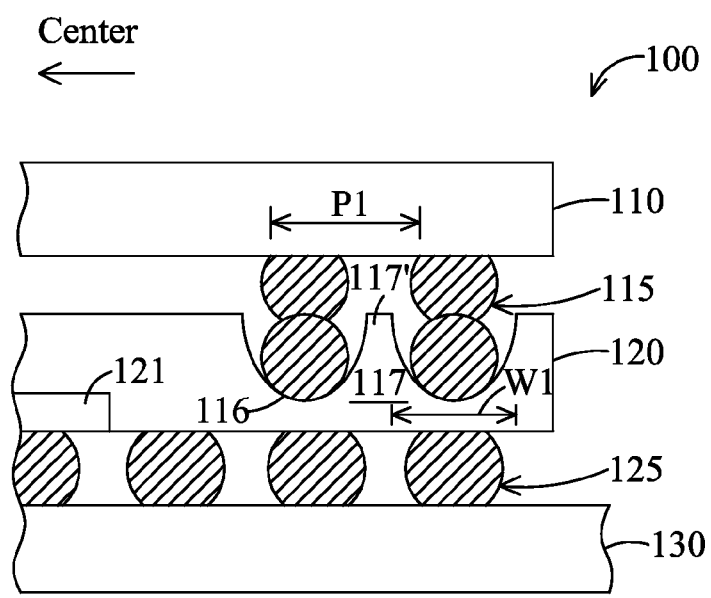
FIG. 1B is a cross-sectional view of a portion of the PoP package of FIG. 1A cut along line P-P, in accordance with some embodiments.

Package 110 is bonded to package 120 via connectors 115, and package 120 is bonded to substrate 130 via connectors 125. FIG. 1B is a cross-sectional view 150 of a portion of the PoP package of FIG. 1A cut along line P-P, in accordance with some embodiments. FIG. 1B shows connectors 115 and 125 near the edge of chip package 100. FIG. 1B also shows a semiconductor die 121 of package 120. There are connectors 125 near the center of package 120, in some embodiments. A portion of connectors 115 is formed in openings 116 of package 120. Openings 116 are formed by etching a molding material of package 120. As a result, connectors 115 may also be called through molding vias (TMVs). In some embodiments, the openings 116 are formed by laser drills. For example, a width $W_1$ of openings 116 is in a range from about 300 µm to about 600 µm, in accordance with some embodiments. In some embodiments, pitch $P_1$ between two adjacent connectors 115 is in a range from about 400 µm to about 800 µm. The relatively large pitch limits design flexibility and complexity that are needed for advanced devices. In addition, laser drilling to form openings 116 leaves isolation regions 117 between connectors 115 relatively thin in top portions 117', which increases the risk of shorting between connectors 115.

Packaging frames have conductive columns with thermal dissipation function similar to through substrate vias and are fit around packaged dies. When packaging frames are fixed around packaged dies to create packages, the form factors for such packages are smaller than packages that utilize interposers. A form factor of a package refers to the size and shape of the package. The examples of such packaging frames include, but are not limited to, DreamPak of ASM Pacific Technology Ltd. of Singapore, and Leadless-aQFN by ASE Inc. of Taipei, Taiwan.

Figure 2:
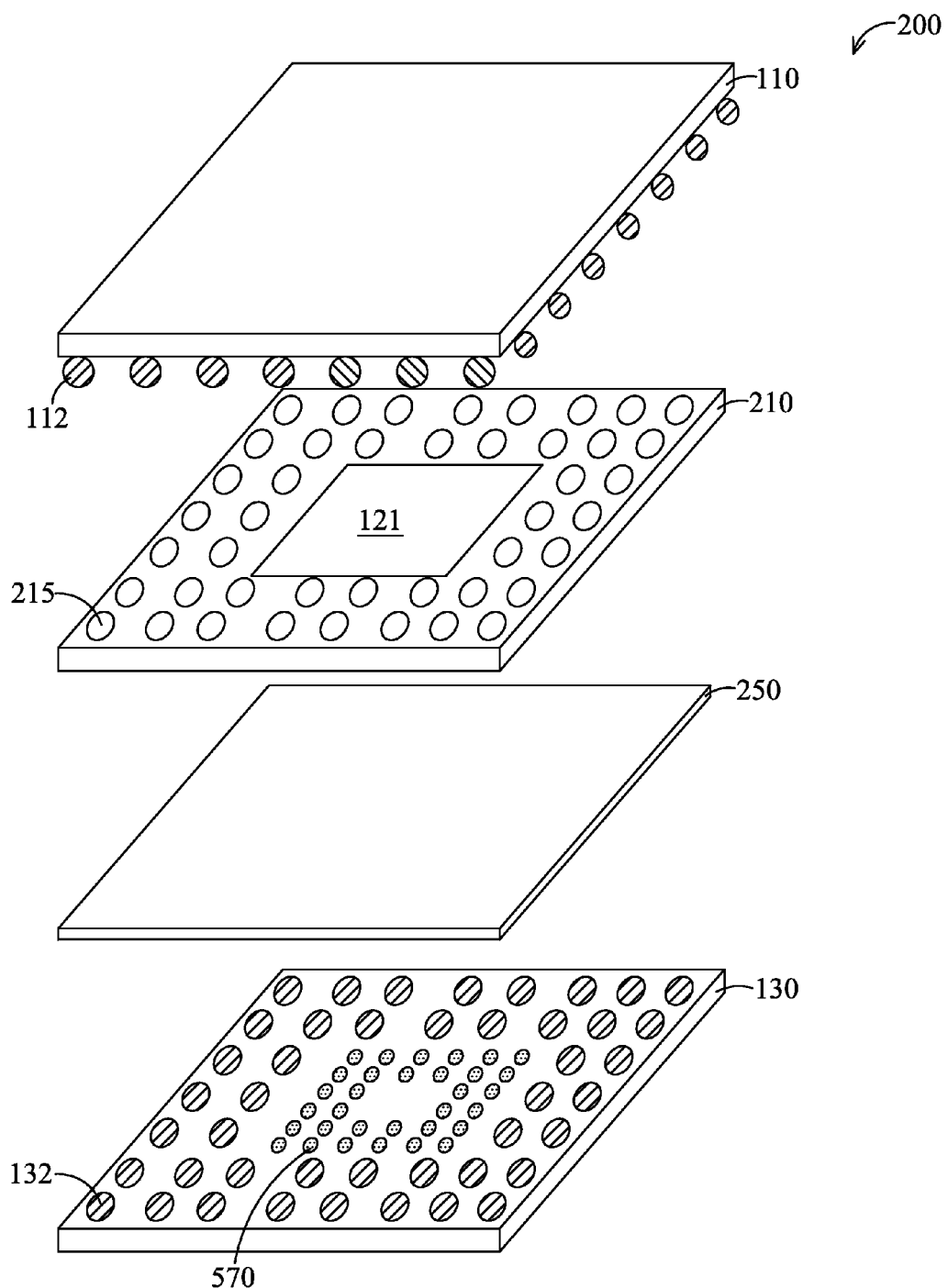
FIG. 2 is an exploded view of a PoP package, in accordance with some embodiments.

FIG. 2 is an exploded view of a PoP package 200 including a package 110, a die 121, an interposer frame 210, a no-flow underfill (NUF) layer 250, and a substrate 130, in accordance with some embodiments. Package 110 and substrate 130 have been described above. Bumps 510 are bonded to bumps (not shown) on die 121. NUF layer 250 surrounding the bumps 510 and bumps on die 121 is pushed aside to allow the bumps to be bonded together.

The interposer frame 210 has through substrate holes (TSHs) 215, which allow the bumps (or balls) 112 on package 110 to bond with bumps (or balls) 132 of substrate 130, in accordance with some embodiments. Portions of bumps 112 and portions of bumps 132 reflow to fill the through substrate holes (TSHs) 215 to form connectors that electrically couple the package 110, the substrate, and/or the die 121. The TSHs 215 may be formed by mechanical drill or by laser drill and the width of the openings can be made smaller than TMVs described above. In some embodiments, the width of TSHs formed by laser drill ranges from about 50 µm to about 250 µm, which is smaller than width $W_1$ of TMVs described above. The smaller width of TSHs and the bonding process enables the pitch of the connectors on interposer frame 210 to be smaller than pitch $P_1$ of connector 115 described above. In some embodiments, the pitch of connectors on interposer frame 210 may be in a range from about 75 µm to about 500 µm. In some embodiments, the pitch of connectors on interposer frame 210 may be in a range from about 75 µm to about 300 µm.

Figure 3A:
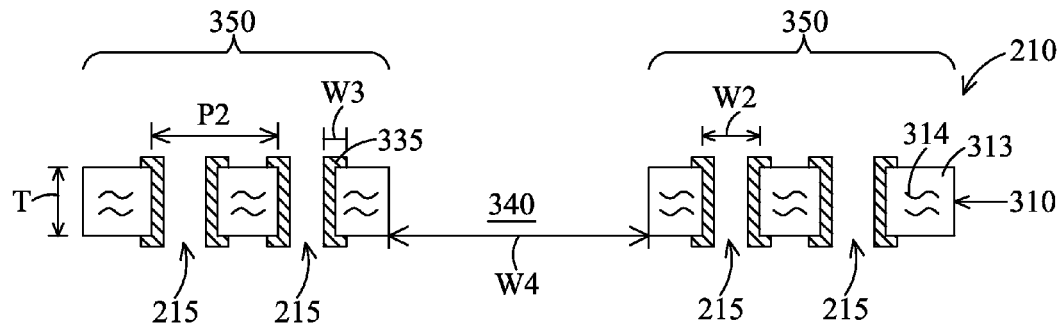
FIG. 3A is a cross-sectional view of an interposer frame, in accordance with some embodiments.

FIG. 3A is a cross-sectional view of an interposer frame 210, in accordance with some embodiments. The interposer frame Interposer frame 210 includes a substrate 310. Substrate 310 comprises a dielectric material. In some embodiments, substrate 310 is made of a base material 313 mixed with one or more additives 314. For example, substrate 310 may be made of polyimide (a base material 313) mixed with glass fiber (an additive 314) to increase the strength of substrate 310. Substrate 310 is manufactured to have sufficient strength and stiffness to sustain stress applied on it during a packaging process and during usage. In some embodiments, the Young's modulus of substrate 310 is in a range from about 5 GPa to about 100 GPa. Glass fiber has a higher stiffness than polyimide. Various amount or percentage of glass fiber may be added to the polyimide to increase the strength of substrate 310. In some embodiments, the weight percentage of glass fiber in substrate 310 is in a range from about 5% to about 60%.

Base material 313 may be made of other materials, such as glass, silicon, gallium arsenide, silicon on insulator ("SOI"), epoxy, polymers (thermoset or thermoplastic), molding compound, epoxy, plastic, ceramic, or combinations thereof. Examples of plastic materials for base material 313 include, but are not limited to, polyvinyl chloride (PVC), acrylonitrile butadiene styrene (ABS) polymer, polypropylene (PP), polyethylene (PE), polystyrene (PS), polymethyl mechacrylate, (PMMA), polyethylene terephthalate (PET), polycarbonates (PC), or polyphenylenesulfide (PPS).

Various additives 314 may be added to base material 313 to provide desirable properties of substrate 310. For example, a flame resistant material (an additive 314) can be added to base material 313. In some embodiments, the substrate 310 includes bismaleimide triazine (BT) resin, and/or FR-4 (a composite material composed of woven fiberglass cloth with an epoxy resin binder that is flame resistant). In some alternative embodiments, substrate 310 includes epoxy, resin, and glass fiber, or resin coated copper. A thickness T of substrate 310 is in a range from about 20 µm to about 500 µm.

Interposer frame 210 also includes through substrate holes (TSHs) 215 in the frame region 350. The TSHs 215 have a width $W_2$ in a range from about 50 µm to about 250 µm, in accordance with some embodiments. The TSHs have a pitch $P_2$ in a range from about 75 µm to about 500 µm, in accordance with some embodiments. In some embodiments, the pitch $P_2$ is in a range from about 75 µm to about 300 µm. The TSHs 215 are covered by a conductive layer 335. In some embodiments, conductive layer 335 is made of copper or a copper alloy. The conductive layer 335 may include more than one sub-layer. Conductive layer 335 may be formed by various processes, such as sputtering, plating, or a combination of both. In some embodiments, conductive layer 335 includes copper and can be pure copper or a copper alloy. In some alternative embodiments, at least one other conductive material is used instead of copper. For example, conductive layer 335 may include solder, solder alloy, gold, or gold alloy, etc. Exemplary elements in a solder alloy may include Sn, Pb, Ag, Cu, Ni, bismuth (Bi), or combinations thereof. In some embodiments, conductive layer 335 has a thickness in a range from 2 µm to about 40 µm.

The conductive layer 335 also covers a portion of surfaces of substrate 310. In some embodiments, the width $W_3$ of conductive layer(s) 335 surrounding peripheries of through substrate holes (TSHs) 215 on surfaces of substrate 310 is in a range from about 2 µm to about 100 µm. Interposer frame 210 also includes an open region 340 for placing a semiconductor die 121 of FIG. 2. Substrate material in open region 340 is removed by a mechanical process, such as routing. A routing process uses a sharp tool to cut through substrate to remove substrate materials defined at a predetermined region. Other suitable mechanical processes may also be used. The width $W_4$ of region 340 is in a range from about 2 mm to about 500 mm in some embodiments.

Figure 3B:
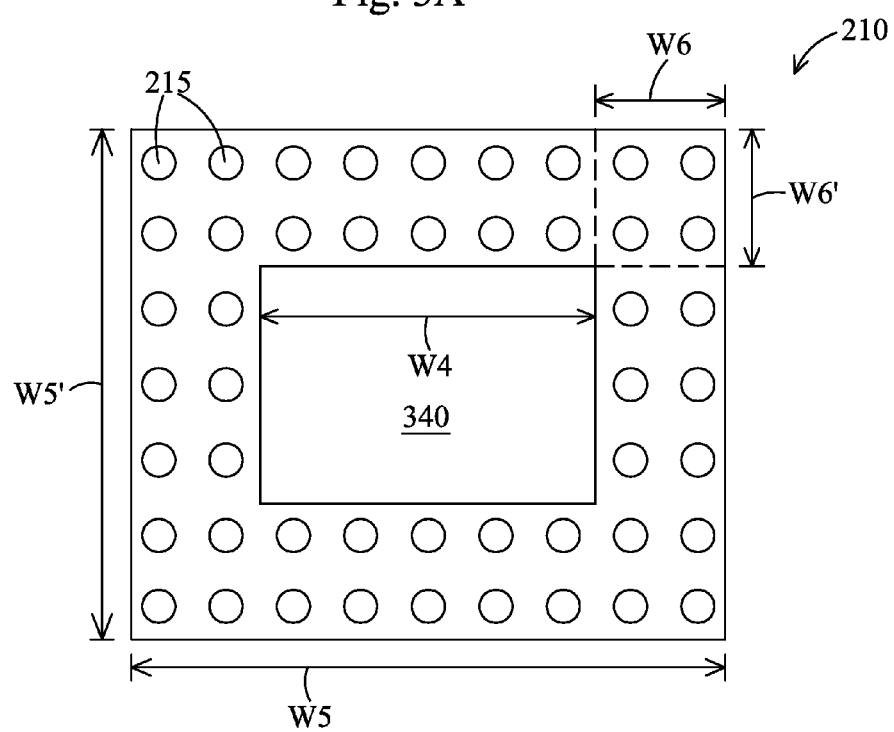
FIG. 3B is a top view of interposer frame of FIG. 3A, in accordance with some embodiments.

FIG. 3B is a top view of interposer frame 210, in accordance with some embodiments. FIG. 3B shows that through substrate holes (TSHs) 215 are distributed across the interposer frame 210. The interposer frame in FIG. 3B has a rectangular shape. In some embodiments, the width $W_5$ of interposer frame 210 in a range from about 2.5 mm to about 800 mm. In some alternative embodiments, interposer frame 210 could be a square shape or other shapes. The frame of the interposer frame 210 of FIG. 3B has a width $W_6$ in a first direction and a width $W_6'$ in a second direction, which is perpendicular to the first direction. In some embodiments, the width $W_6$ equals the width $W_6'$. In some alternative embodiments, $W_6$ could be different from $W_6'$. For example, width $W_6$ could be wider than width $W_6'$, and the interposer frame 300 is set to have more columns (or rows) of through substrate holes (TSHs) 215 along the first direction than that along the second direction. There could be any number of rows and/or columns of through substrate holes (TSHs) 215 for interposer frame 210. The width $W_6$ or $W_6'$ is in a range from about 300 µm to about 300 mm in some embodiments.

Figure 3C:
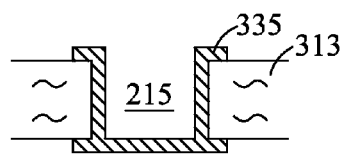
FIG. 3C is a cross-sectional view of a through substrate hole (TSH), in accordance with some embodiments.

The embodiments of interposer frame 210 shown in FIG. 3A shows through substrate holes (TSHs) 215. Alternatively, one end of a TSH 215 could be covered by the conductive layer 335, as shown in FIG. 3C in accordance with some embodiments. Detailed description of exemplary mechanisms for forming interpose frame 210 can be found in Provisional U.S. Patent Application Ser. No. 61/594,141, entitled "Mechanisms for Forming Interposer Frame" and filed on Feb. 2, 2012, which is incorporated by reference herein in its entirety.

Figure 4A:
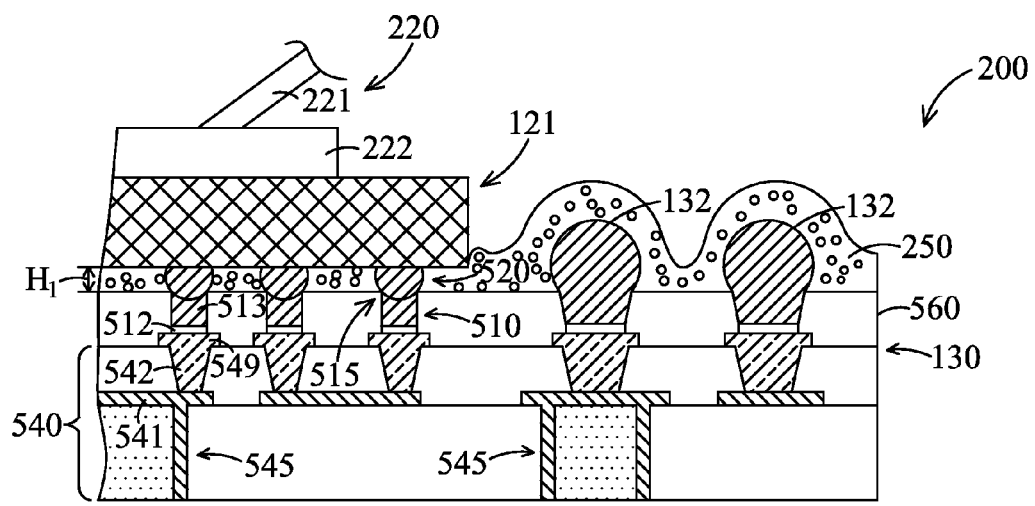
FIGS. 4A-4D are cross-sectional views of a PoP package structure at various manufacturing stages, in accordance with some embodiments.

FIGS. 4A-4D are cross-sectional views of a PoP package structure 200 at various manufacturing stages, in accordance with some embodiments. FIG. 4A shows the no-flow underfill (NUF) layer 250 is placed between die 121 and substrate 130, in accordance with some embodiments. The NUF layer 250 is a dielectric layer and serves as an underfill. In some embodiments, NUF layer 250 is in liquid form and is dispensed on the substrate surface, such as by spraying, before another package or substrate is bonded to the substrate. In some embodiments, NUF layer 250 is a non-conductive paste (NCP) and is applied over the surface 131 of substrate 130 and exposed surfaces of bump structures 510 and bumps 132, which surround bump structures 510. Alternatively NUF layer 250 is formed as layer prior to being placed over substrate 130. FIG. 4A shows that die 121 is held by a die holder 220. Die holder 220 places die 121 over NUF layer 250 with bumps 520 of die 121 aligned with bump structures 510 of substrate 130. Substrate 130 has a number of bump structures 510, which are bonded to bumps 520 on semiconductor die 121. Bump structures 510 are separated from one another by a passivation layer 560. In some embodiments, the passivation layer 560 is made of polymers, such as polyimide. Bump structures 510 are formed over metal pads 549 and may include metal-finish layer 512 and pre-solder layer 513, in accordance with some embodiments. Bump structures 510 are electrically connected to connectors (not shown) on the other side (opposite the side where the bump structures are formed thereon) of substrate 130 through conductive structures in interconnect 540 in substrate 130. Interconnect 540 may include metal layers 541, vias 542, and plating through holes (PTHs) 545, in accordance with some embodiments. PTHs 545 are electrically connected to connectors (not shown) on the other side substrate 130 described above. The conductive structures of interconnect 540 are insulated by dielectric material(s), which could be silicon dioxide, low-dielectric-constant dielectric, and/or doped dielectric.

Die 121 is pressed against NUF layer 250 and substrate 130 to enable bonding bumps 520 to bump structures 510. During the pressing process, bumps 520 of die 121 pushes NUF layer 250 from the surface of bump structures 510 to come in contact with the conductive surfaces of bump structures 510. Bumps 520 of die 121 are heated to enable bonding between bumps 520 and bumps structures 510 to form bonded structure 151. In some embodiments, bumps 520 and bump structures 510 include solder. The solder in bumps 520 and bump structures 510 are bonded together by the heat provided by bumps 520. The bonding of bumps 520 and bumps structures 510 occurs without a conventional reflow process, which increases the temperature of substrate 130, NUF layer 250 and die 121. Due to mismatch of coefficients of thermal expansion (CTEs) of elements in substrate 130, NUF layer 250 and elements in die 121 during a reflow process, the bonded structures 515 are likely to crack at the interfaces with dielectric layers near the bonded structures 515, which affect the yield and reliability of the packaged structure 200. Mismatch of CTEs can also cause other issues, such as interfacial delamination, not described above. Better bonded structures 515 also improve the reliability margin of reliability tests, such as board-level thermal cycling and drop test. A drop test is a test of dropping a package from a certain height and observing if the package can survive the impact with the ground. Drop test is important for hand-held devices. Eliminating a reflow process improves yield and reliability of packaged structure 200.

In some embodiments, bumps 520 of die 121 are heated by die holder 220 (or the temperature of bump 520 is raised by the heat from die holder 220). Die holder 220 includes an arm 221 and a holding head 222, in accordance of some embodiments. In some embodiments, heating elements (not shown) in holding head 222 provide heat to increase the temperature of the body of die 121, which transmits heat to bumps 520. In some other embodiments, die 121 and bumps 520 are heated prior to being picked up the die holder 220. In some embodiments, heating elements on die holder 220 provide additional heat on the already-heated die 121 to maintain the temperature of bumps 520 (of die 121) or to increase the temperature of bumps 520 to a desired value. If bumps 520 and bumps structures 510 include lead-free solder, whose bonding temperature is about 220° C., bumps 520 and the remaining portions of die 121 are heated to a temperature in a range from about 230° C. to about 260° C., in accordance with some embodiments. Other temperature ranges are also possible. The heated bumps 520 transfer some heat (or energy) to bump structures 510 and enable bonding between bumps 520 and bump structures 510. If bumps 520 and bump structures 510 are bonded by eutectic bonding, which occurs at about 190° C., bumps and the remaining portions of die 121 are heated to a temperature in a range from about 200° C. to about 230° C. Other temperature ranges are also possible.

As mentioned above, when die 121, NUF layer 250 and substrate 130 are pressed together to form bonded structures 515, portions of NUF layer 250 near bonded structures 515 are pushed open to allow the contact between bumps 520 and bump structures 510. NUF layer 250 is deformable to facilitate the ability to be pushed open. In addition, NUF layer 250 is an underfill and a dielectric layer. In some embodiments, NUF layer 250 is made of a polymer, which is fluidic under room temperature and hardens when heated. The fluidic nature of the NUF layer 250 allows the underfill formed die 121 and substrate 130 to have no voids. For example, the heat provided by the bonded structures 515 could harden NUF layer 250 to make it an underfill supporting bonded structures 515. The support provided by NUF layer 250 also reduces delamination at interfaces between conductive layer(s) and dielectric layer(s) near the NUF layer 250. In some embodiments, NUF layer 250 is made of a base material, such as epoxy resin, mixed with filler(s) and/or additives. An example of filler is $SiO_2$ filler, used to increase the strength and/or to adjust the CTE of NUF layer 250. Other types of additives can be added to change properties of the NUF layer 250. The CTE of NUF layer 250 is selected to match the CTEs of the layers surrounding NUF layer 250, in accordance with some embodiments. In some embodiments, the CTE of NUF layer 250 is in a range from about 3 ppm/° C. to about 50 ppm/° C. In some embodiments, the base material of NUF layer 250 includes polyolefin, such as polyethylene or polyvinyl chloride, polyester, such as polyethylene terephthalate, polycarbonate, or a combination thereof. Other types of polymers may also be used. In some embodiments, NUF layer 250 includes thermoset polymers.

Alternatively, a hardening process is applied to harden the NUF layer 250 at a later and separate operation. The NUF layer 250 fills in the space between bump structures 515. In some embodiments, NUF layer 250 has a thickness $H_1$ in a range from about 20 μm about 120 μm.

Figure 4B:
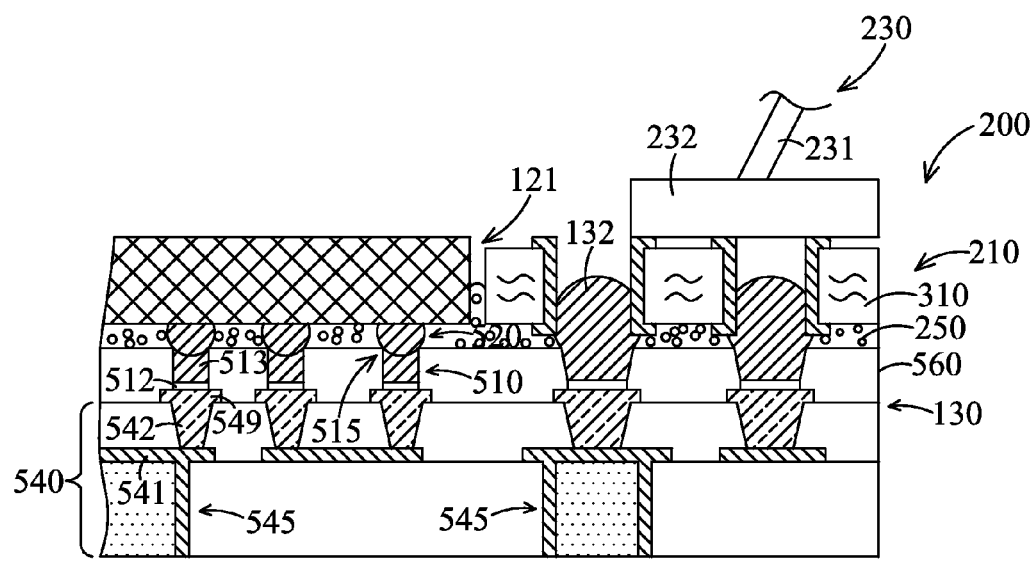

After die 121 is bonded to substrate 130, interposer frame is bonded to substrate 130. FIG. 4B shows interposer frame 210 is bonded to substrate 130 by bonding the conductive layer 335 of TSHs 215 to bumps 132 surrounding die 121, in according to some embodiments. Interposer frame 210 is also picked and placed over substrate 130 and NUF layer 250 by a frame holder 230. Frame holder 230 places frame 210 over NUF layer 250 with TSHs 215 of interposer frame 210 aligned with bumps 132 of substrate 130. Interposer frame 210 is positioned to have its opening 340 (FIG. 3B) surrounding die 121.

Frame holder 230 includes an arm 231 and a holding head 232, in accordance of some embodiments. In some embodiments, heating elements (not shown) in holding head 232 provide heat to increase the temperature of the body of interposer frame 210, which includes conductive layer 335 of TSHs 215. The placement interposer frame 210 over substrate 130 and bonding of interposer frame 210 to substrate 130 are similar those of die 121 to substrate 130. Interposer frame 210 pushed away NUF layer 250 on the surface of bumps 132 to make contact with bumps 132. The conductive layer 335 of interposer frame 210 conducts heat which enables the bonding between conductive layer 335 and bumps 132. Conductive layer 335 of TSHs 215 and the remaining interposer frame 210 could be heated by one of the mechanisms used to bond die 121 to substrate 130 described above to enable bonding between the conductive layer 335 and bumps 132.

Figure 4C:
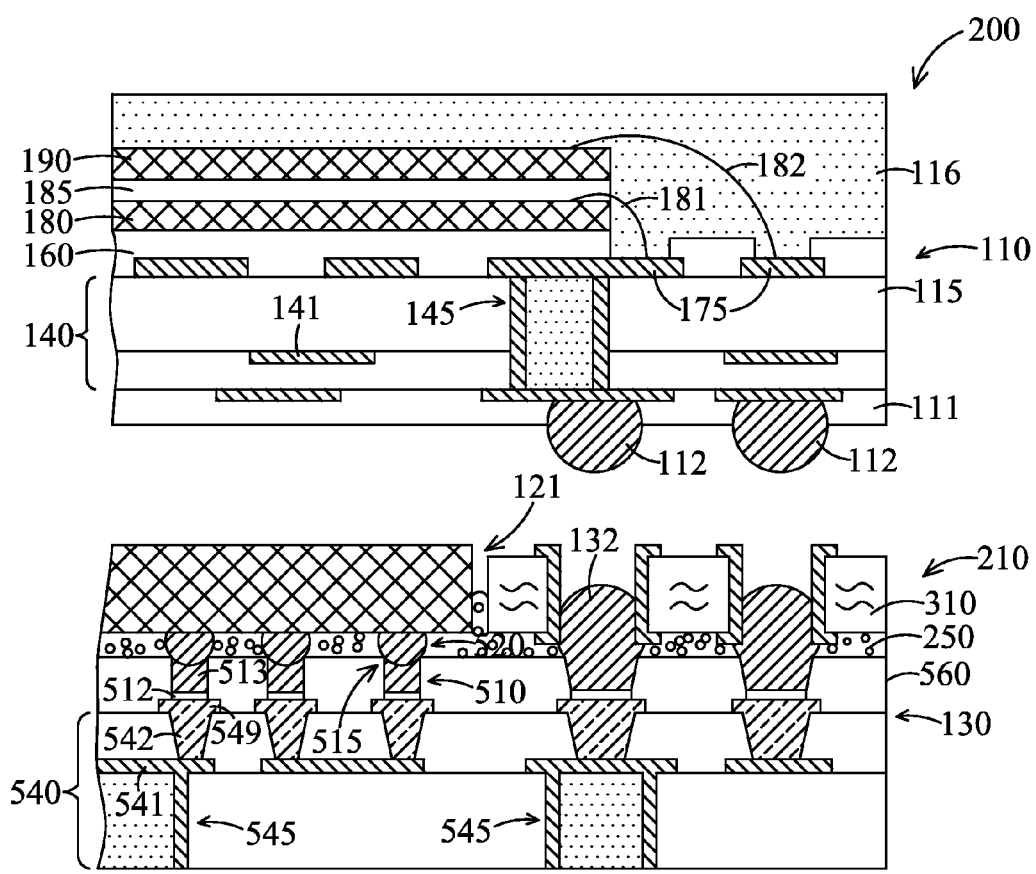
Figure 4D:
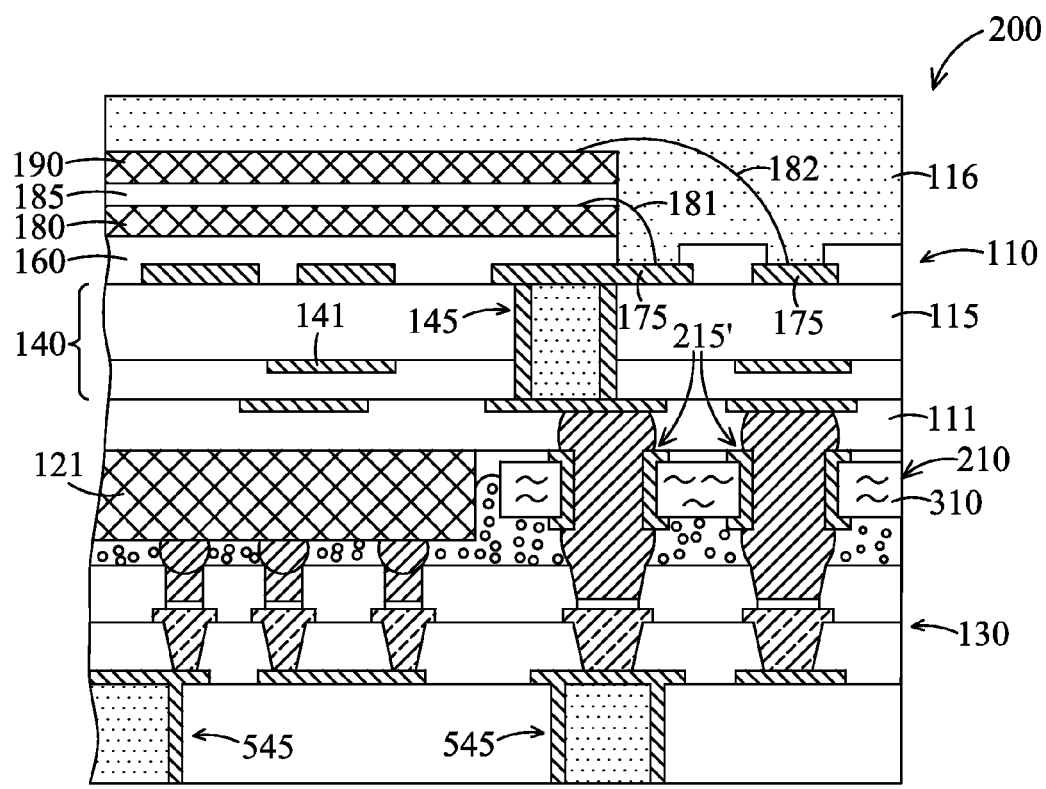

After interposer fame 210 and die 121 are bonded to substrate 130, package 110 is placed over substrate 130, as shown in FIG. 4C in accordance with some embodiments. FIG. 4C shows that bumps 112 on package 110 are also aligned over TSHs 215 bonded to bumps 132 on substrate 130. Package 110 and substrate 130 are pressed against interposer frame 210 and the entire package is then reflowed to allow solder material in bumps 112 and bumps 132 to fill the spaces in TSHs 215. The solder material in bumps 112 comes in contact the solder material in bumps 132 to fill the TSHs 215, which becomes through substrate vias (TSVs) 215', as shown in FIG. 4D in accordance with some embodiments.

Bumps 112 of package 110 are isolated from one another by a passivation layer 111. FIGS. 4C and 4D show that package 110 has two semiconductor chips 180 and 190, which are stacked on each other and are separated by a glue layer 185. FIGS. 4C and 4D also show that chips 180 and 190 are electrically connected to contacts 175 on substrate 115 of package 110 via wires 181 and 182. Chips 180 and 190, and wires 181 and 182 are protected by a molding compound 116. Substrate 115 of package 110 includes interconnect 140. Interconnect 140 may include metal layers 141, vias (not shown), and plating through holes (PTHs) 145, in accordance with some embodiments. The conductive structures of interconnect 140 are insulated by dielectric material(s), which could be silicon dioxide, low-dielectric-constant dielectric, and/or doped dielectric. Contacts 175 are separated from each other by a passivation layer 160, which is made of a dielectric material. In some embodiments, passivation layer 160 is made of polymers, such as polyimide.

Substrate 310 of interposer frame 210 comes in contact with NUF layer 250, which surrounds semiconductor chip 121. NUF layer 250 also comes in contact with passivation layer 560 of substrate 130 and passivation layer 111 of package 110. As mentioned above, the CTE of NUF layer 250 is selected to match the CTEs of the layers surrounding NUF layer 250, in accordance with some embodiments. The CTE of NUF layer 250 is selected to be close to the CTE of the passivation layers 560 and 111, in some embodiments. As mentioned above, the passivation layers 560 and 111 may be made of polymers, such as polyimide. In some embodiments, CTEs of passivation layers 560 and 111 are in a range from about 3 ppm/° C. to about 50 ppm/° C. In some embodiments, CTE of NUF layer 250 is in a range from about 3 ppm/° C. to about 50 ppm/° C. The base material 313 and additives 314 (FIG. 3A) is selected to achieve a CTE of substrate 310 of interposer frame 210 to be close to the CTEs of NUF layer 250, passivation layer 560, and passivation layer 111, in accordance with some embodiments. In some embodiments, the CTE of substrate 310 is in a range from about 3 ppm/° C. to about 50 ppm/° C.

Due to better matching of CTEs of substrate 310 of interposer frame 210, NUF layer 250, and the surrounding materials (such as passivation layers 560, 111), the PoP package 200 can withstand better thermal cycling during packaging process and during usage. Packages using TMVs, such as PoP package of FIGS. 1A and 1B, could have delamination of solder joints due to CTE mismatch. By using an interposer frame 210 and NUF layer 250 with better CTE match, the problem with delaminating of solder joins could be greatly reduced. In addition, the TSVs 215' formed by the TSHs 215 are better insulated from each other than the TMVs shown in FIG. 1B. The insulating layer, made of substrate 310, between TSVs 215' has about the same widths at the top and at the bottom of TSVs 215'. In contrast, the isolation regions 117 between connectors 115 in FIG. 1B are relatively thin in the top portions 117' in comparison with the distance between TSVs 215', which increase the risk of shorting between connectors 115.

In addition, by adding strength enhancers, such as fiber glass, the strength of substrate 310 is better than the strength of molding compound of package 120. As a result, PoP package 200 using interposer frame 210 described above would perform better under drop test than PoP package of FIGS. 1A and 1B.

The mechanisms of forming PoP package structure 200 described above in FIGS. 4A-4D involves bonding the semiconductor die 121 to substrate 130 before boding interposer 210 to substrate 130. However, the order of bonding can be reversed. The interposer frame 210 is bonded to substrate 130 before die 121 is bonded to substrate 130, in accordance with some embodiments.

Exemplary embodiments of forming a PoP package by using an interposer and an NUR layer are provided. The interposer frame improves the form factor of the package, enables the reduction in the pitch of the bonding structures. In some embodiments, by using the NUF layer to assist forming a PoP package, a conventional reflow process is omitted. The NUF layer enables a semiconductor die and an interposer frame be bonded to a substrate by utilizing the heat on the connectors of the semiconductor die and on the connectors of the interposer frame for bonding. The heat provided by the semiconductor die and the interposer frame also transforms the NUF layer 250 into an underfill. PoP structures formed by using the interposer frame and the NUF layer improve yield and have better reliability performance.

One aspect of this description relates to a method of forming a package on a package structure. The method includes applying a no-reflow underfill (NUF) layer over a substrate, wherein the substrate has at least one first bump and a plurality of second bumps surrounding the at least one first bump. The method further includes bonding a semiconductor die to the at least one first bump. The method further includes bonding an interposer frame to the plurality of second bumps, wherein the interposer frame surrounds the semiconductor die, wherein the semiconductor die is disposed in an opening of the interposer frame.

Another aspect of this description relates to a semiconductor package. The semiconductor package includes a first substrate having at least one first bump and a plurality of second bumps on a surface of the first substrate, wherein the plurality of second bumps surround the at least one first bump. The semiconductor package further includes a die bonded to the at least one first bump. The semiconductor package further includes an interposer frame comprising an opening and at least one through substrate hole (TSH), wherein the die is disposed in the opening. The semiconductor package further includes a second substrate having at least one third bump, wherein the at least one third bump extends into the at least one TSH, and the at least one third bump is electrically connected to the at least one second bump of the plurality of second bumps.

Still another aspect of this description relates to a semiconductor package. The semiconductor package includes a substrate with a first plurality of bumps. The semiconductor package further includes an interposer frame, wherein the interposer frame includes a plurality of through substrate holes (TSHs) and an opening defined therein, wherein a portion of at least one bump of the first plurality of bumps extends into a first TSH of the plurality of TSHs, and the interposer frame comprises a conductive feature extending across a second opening defined by a second TSH of the plurality of TSHs. The semiconductor package further includes a semiconductor die disposed in the opening. The semiconductor package further includes a no-reflow underfill (NUF) layer filling a space between the semiconductor die and the interposer frame.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a package on a package structure, the method comprising:
   applying a no-reflow underfill (NUF) layer over a substrate having at least one first bump and a plurality of second bumps surrounding the at least one first bump;
   bonding a semiconductor die to the at least one first bump; and
   bonding an interposer frame to the plurality of second bumps, wherein the interposer frame surrounds the semiconductor die, wherein the semiconductor die is disposed in an opening of the interposer frame.

2. The method of claim 1, wherein bonding the interposer frame to the plurality of second bumps comprises bonding at least one second bump of the plurality of second bumps to a conductive layer within a through substrate hole (TSH) of the interposer frame.

3. The method of claim 1, wherein bonding the interposer frame to the plurality of second bumps comprises bonding at least one second bump of the plurality of second bumps to a conductive layer outside of a TSH of the interposer frame.

4. The method of claim 3, wherein bonding the at least one second bump of the plurality of second bumps to the conductive layer comprises preventing the at least one second bump from extending into the TSH.

5. The method of claim 3, wherein bonding the at least one second bump of the plurality of second bumps to the conductive layer comprises bonding the at least one second bump to the conductive layer covering an entirety of the TSH.

6. The method of claim 1, further comprising bonding a package to the plurality of second bumps, wherein the package comprises a plurality of third bumps and each third bump of the plurality of third bumps is bonded to a corresponding second bump of the plurality of second bumps.

7. The method of claim 6, wherein bonding the package to the plurality of second bumps comprises bonding at least one third bump of the plurality of third bumps to the corresponding second bump of the plurality of second bumps within a TSH of the interposer frame.

8. The method of claim 6, wherein bonding the package to the plurality of second bumps comprises bonding at least one third bump of the plurality of third bumps to the corresponding second bump of the plurality of second bumps through a conductive layer covering a TSH of the interposer frame.

9. A semiconductor package comprising:
   a first substrate having at least one first bump and a plurality of pads on a surface of the first substrate, wherein the plurality of pads surround the at least one first bump;
   a die bonded to the at least one first bump;
   an interposer frame comprising an opening and at least one through substrate hole (TSH) having the die is disposed in the opening;
   a no-reflow underfill (NUF) layer between the first substrate and the interposer frame, wherein the NUF layer contacts at least a portion of a conductive layer of the interposer frame;
   a second substrate having at least one conductive structure, wherein the at least one conductive structure extends into the at least one TSH, the at least one conductive structure is electrically connected to at least one pad of the plurality of pads, and a distance from a top surface of the die to the second substrate is less than a distance from a top surface of the interposer frame to the second substrate.

10. The semiconductor package of claim 9, wherein the conductive layer lines the at least one TSH, and a corresponding pad of the plurality of pads is electrically connected to the conductive layer.

11. The semiconductor package of claim 10, wherein the corresponding pad of the plurality of pads is electrically connected to the conductive layer within the at least one TSH.

12. The semiconductor package of claim 10, wherein the corresponding pad of the plurality of pads is electrically connected to the conductive layer outside of the at least one TSH.

13. The semiconductor package of claim 10, wherein the at least one conductive structure is electrically connected to the at least one TSH through the conductive layer.

14. The semiconductor package of claim 9, wherein a space between the second substrate and the interposer frame is substantially free of the NUF layer.

15. The semiconductor package of claim 9, wherein the NUF layer is between the die and the interposer frame.

16. A semiconductor package, comprising:
   a substrate with a first plurality of bumps;
   an interposer frame, wherein the interposer frame includes a plurality of through substrate holes (TSHs) and a first opening defined therein, wherein a portion of at least one bump of the first plurality of bumps extends into a first TSH of the plurality of TSHs, and the interposer frame comprises a conductive feature extending across a second opening defined by a second TSH of the plurality of TSHs;
   a semiconductor die disposed in the first opening;
   a no-reflow underfill (NUF) layer filling a space between the semiconductor die and the interposer frame; and
   a package comprising a second plurality of bumps, wherein a first bump of the second plurality of bumps is electrically connected to a first bump of the first plurality of bumps through the conductive feature.

17. The semiconductor package of claim 16, wherein a second bump of the second plurality of bumps is electrically connected to the at least one bump of the first plurality of bumps within the first TSH.

18. The semiconductor package of claim 16, wherein the interposer frame includes a conductive liner along interior sidewalls of the first TSH, the conductive liner defines a space within the first TSH, and the conductive feature is continuous with the conductive liner.

19. The semiconductor package of claim 9, wherein the NUF layer contacts a sidewall of the interposer frame.

20. The semiconductor package of claim 9, wherein a top surface of the NUF layer is farther from the second substrate than the top surface of the interposer frame.

* * * * *